(12) United States Patent
Lee et al.

(10) Patent No.: US 11,262,881 B2
(45) Date of Patent: Mar. 1, 2022

(54) INPUT SENSING UNIT AND DISPLAY MODULE INCLUDING THE SAME

(71) Applicant: Samsung Display Co., LTD., Yongin-si (KR)

(72) Inventors: Sunhwa Lee, Yongin-si (KR); Mukyung Jeon, Ulsan (KR); Kihyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/920,424

(22) Filed: Jul. 3, 2020

(65) Prior Publication Data
US 2021/0011582 A1 Jan. 14, 2021

(30) Foreign Application Priority Data
Jul. 12, 2019 (KR) .................. 10-2019-0084605

(51) Int. Cl.
*G06F 3/044* (2006.01)
*H01L 27/32* (2006.01)
*G06F 3/041* (2006.01)
*H01L 51/52* (2006.01)

(52) U.S. Cl.
CPC .......... *G06F 3/0446* (2019.05); *G06F 3/0412* (2013.01); *G06F 3/0448* (2019.05); *H01L 27/323* (2013.01); *H01L 27/3244* (2013.01); *H01L 51/5253* (2013.01); *G06F 2203/04112* (2013.01)

(58) Field of Classification Search
CPC .... G06F 3/0445; G06F 3/0448; G06F 3/0412; H01L 27/323; H01L 27/3244; H01L 51/5253

USPC .......................................... 345/174
See application file for complete search history.

(56) References Cited

U.S. PATENT DOCUMENTS

| 9,618,982 B2 * | 4/2017 | Koo ................. G06F 3/0446 |
| 2013/0207911 A1 * | 8/2013 | Barton ............... H03K 17/962 345/173 |
| 2015/0275040 A1 * | 10/2015 | Shi .................... C09D 175/16 522/18 |

(Continued)

FOREIGN PATENT DOCUMENTS

| KR | 10-2019-0020213 | 2/2019 |
| KR | 10-2020-0092535 | 8/2020 |

*Primary Examiner* — Prabodh M Dharia
(74) *Attorney, Agent, or Firm* — H.C. Park & Associates, PLC

(57) ABSTRACT

A display module including a display panel, and an input sensing unit disposed on the display panel and having a sensing area and a non-sensing area adjacent to the sensing area, the input sensing unit including a plurality of first conductive patterns overlapping the sensing area, extending in a first direction, and arranged in a second direction perpendicular to the first direction, and a plurality of second conductive patterns overlapping the sensing area, electrically insulated from the first conductive patterns, extending in the second direction, and arranged in the first direction, in which at least one of the first conductive patterns includes a first pattern and a second pattern, the second pattern having a partial shape of the first pattern and disposed adjacent to the non-sensing area, and the second pattern has a line width greater than that of the first pattern in a plan view.

20 Claims, 13 Drawing Sheets

(56) References Cited

U.S. PATENT DOCUMENTS

| | | | | |
|---|---|---|---|---|
| 2016/0004358 A1* | 1/2016 | Frey | ...................... | G06F 3/0416 |
| | | | | 345/174 |
| 2017/0308232 A1* | 10/2017 | Park | ...................... | G06F 3/0446 |
| 2019/0056819 A1* | 2/2019 | Moon | ................... | G06F 3/0446 |
| 2020/0110499 A1* | 4/2020 | Lee | ....................... | H01L 27/323 |
| 2020/0167040 A1* | 5/2020 | Shepelev | .............. | G06F 3/0412 |
| 2020/0371621 A1* | 11/2020 | Moon | ................... | G06F 3/0443 |
| 2021/0159164 A1* | 5/2021 | Han | ...................... | H01L 23/528 |

\* cited by examiner

INPUT SENSING UNIT AND DISPLAY MODULE INCLUDING THE SAME

CROSS-REFERENCE TO RELATED APPLICATION

This application claims priority from and the benefit of Korean Patent Application No. 10-2019-0084605, filed on Jul. 12, 2019, which is hereby incorporated by reference for all purposes as if fully set forth herein.

BACKGROUND

Field

Embodiments of the invention relate generally to a display device, and more specifically, to an input sensing unit and a display module including the same.

Discussion of the Background

A display device includes a display area, on which an image is displayed. The display area may have having a regular shape, such as a rectangular or circular shape, but also may have an irregular shape. For example, the display device may display an image through the display area having various shapes and surface areas.

Also, the display device may include an input sensing unit that senses a touch event. The input sensing unit includes a sensing area, on which sensing electrodes are disposed. The sensing area may overlap the display area and a non-sensing area disposed adjacent to the sensing area, and signal lines may be disposed on the sensing area. The sensing area may have an irregular shape.

The above information disclosed in this Background section is only for understanding of the background of the inventive concepts, and, therefore, it may contain information that does not constitute prior art.

SUMMARY

Input sensing units and a display module including the same constructed according to embodiments of the invention have improved sensing reliability with respect to an external input.

Additional features of the inventive concepts will be set forth in the description which follows, and in part will be apparent from the description, or may be learned by practice of the inventive concepts.

A display module according to an embodiment includes a display panel, and an input sensing unit disposed on the display panel and having a sensing area and a non-sensing area adjacent to the sensing area, the input sensing unit including a plurality of first conductive patterns overlapping the sensing area, extending in a first direction, and arranged in a second direction perpendicular to the first direction, and a plurality of second conductive patterns overlapping the sensing area, electrically insulated from the first conductive patterns, extending in the second direction, and arranged in the first direction, in which at least one first conductive pattern of the first conductive patterns includes a first pattern and a second pattern, the second pattern having a partial shape of the first pattern and disposed adjacent to the non-sensing area, and the second pattern has a line width greater than that of the first pattern in a plan view.

The first conductive patterns may be divided into a first regular group and a first irregular group adjacent to the first regular group, and each of first conductive patterns in the first irregular group may correspond to the one first conductive pattern.

The first irregular group may include two outermost first conductive patterns in the sensing area.

The second patterns of the first conductive patterns in the first irregular group may have different line widths from each other.

The first patterns of the first conductive patterns in the first irregular group may have the same line width.

The first conductive patterns of the first regular group may have the same shape.

The first conductive patterns of the first irregular group may have shapes different from each other.

Each of the first pattern and the second pattern may be formed in plural, and the second patterns may include first sub-patterns and second sub-patterns facing each other with the plurality of first patterns interposed therebetween.

At least one second conductive pattern of the second conductive patterns may include a third pattern and a fourth pattern, the fourth pattern having a partial shape of the third pattern and disposed adjacent to the non-sensing area, and the fourth pattern may have a line width greater than that of the third pattern in a plan view.

The second conductive patterns may be divided into a second regular group and a second irregular group adjacent to the second regular group and having different shapes, and each of second conductive patterns in the second irregular group may correspond to the one second conductive pattern.

The second conductive patterns of the second regular group may have the same shape, and the second conductive patterns of the second irregular group may have different shapes from each other.

The first pattern and the third pattern may have the same line widths, and the second pattern and the fourth pattern may have line widths different from each other.

Each of the first conductive patterns and the second conductive patterns may have a mesh shape.

The line width of the second pattern may be in a range of 1.0 to 2.5 times of the line width of the first pattern.

The display panel may include a substrate, a display element layer disposed on the substrate, and an encapsulation layer disposed on the display element layer, and the input sensing unit may be directly disposed on the encapsulation layer.

A display module according to another embodiment includes a display panel, and an input sensing unit disposed on the display panel and having a sensing area and a non-sensing area adjacent to the sensing area, the sensing area including a first sensing area and a second sensing area protruding from the first sensing area in a first direction in a plan view, the input sensing unit including a plurality of first conductive patterns overlapping the first sensing area, extending in the first direction, and arranged in a second direction perpendicular to the first direction, a plurality of second conductive patterns overlapping the first sensing area, electrically insulated from the first conductive patterns, extending in the second direction, and arranged in the first direction, and a notch conductive pattern overlapping the second sensing area, in which the notch conductive pattern has a line width greater than that of each of the second conductive patterns in a plan view.

Each of the first conductive patterns, the second conductive patterns, and the notch conductive pattern may have a mesh shape, and each of the first conductive patterns and each of the second conductive patterns may have the same line width.

The second sensing area may include a first sub-sensing area and a second sub-sensing area spaced apart from the first sub-sensing area and facing the first sub-sensing area in the second direction, and the notch conductive pattern may include a first notch sensing pattern overlapping the first sub-sensing area and a second notch sensing pattern overlapping the second sub-sensing area.

A distance between the first sub-sensing area and the second sub-sensing area in the second direction may be in a range of 20% to 50% of the sum of a length of the first sub-sensing area and a length of the second sub-sensing area in the second direction.

An input sensing module according to still another embodiment includes a plurality of first conductive patterns extending in a first direction and arranged in a second direction perpendicular to the first direction, and a plurality of second conductive patterns electrically insulated from the first conductive patterns, extending in the second direction, and arranged in the first direction, in which at least one of the first conductive patterns includes a first pattern and a second pattern having a partial shape of the first pattern, and the second pattern has a line width greater than that of the first pattern in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
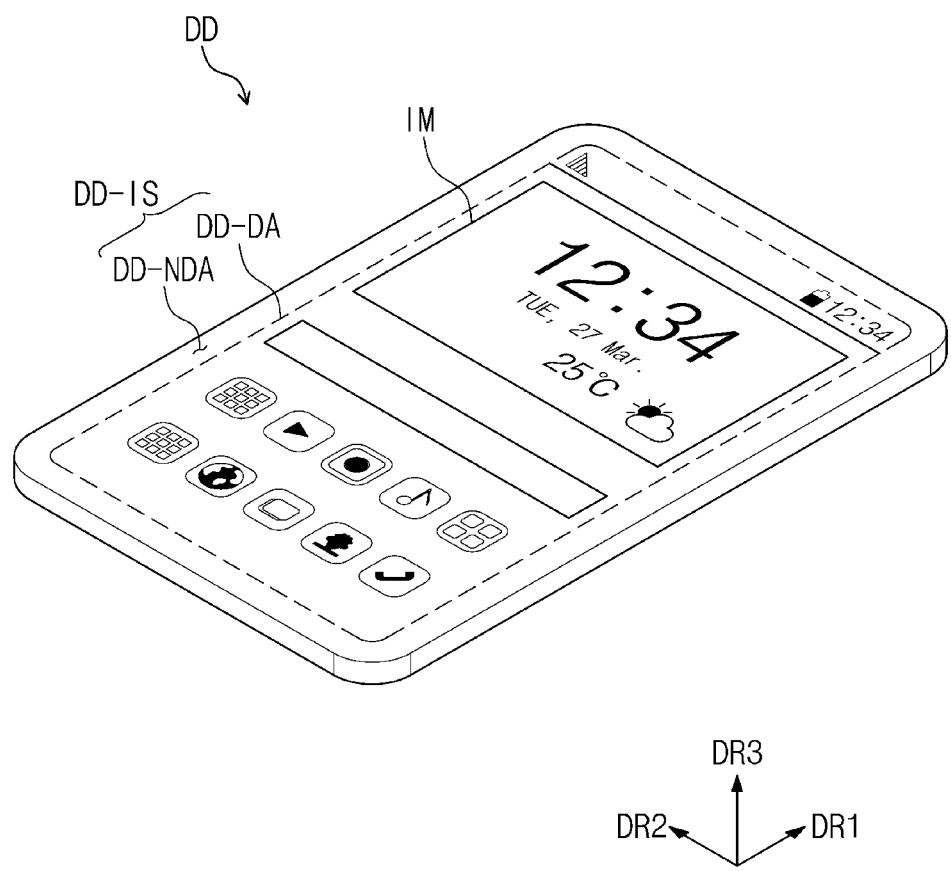
FIG. 1A is a perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
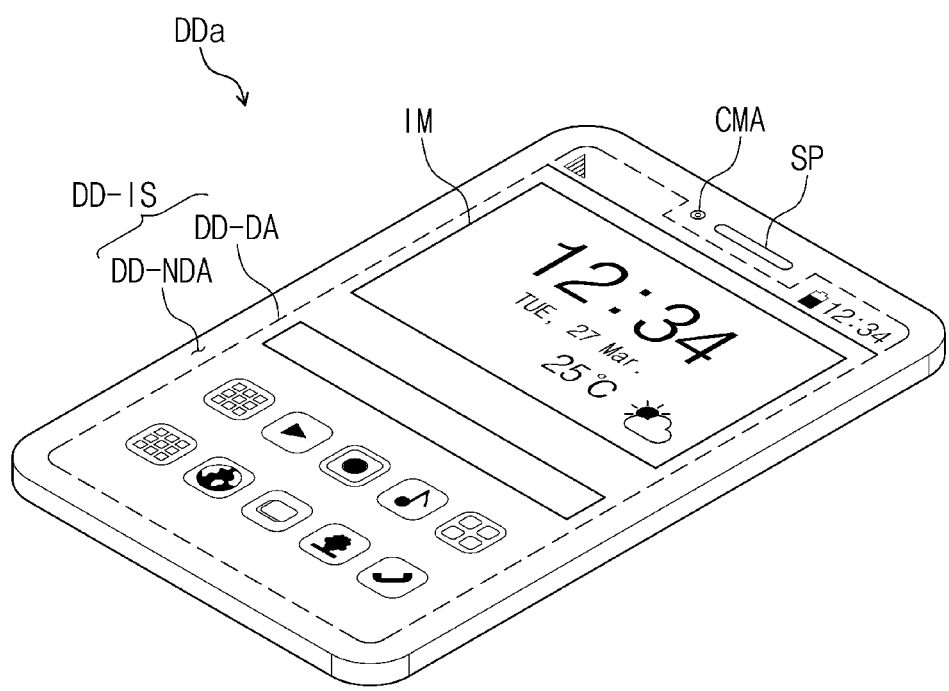
FIG. 1B is a perspective view of a display device according to another embodiment.

FIG. 1A is a perspective view of a display device according to an embodiment. FIG. 1B is a perspective view of a display device according to another embodiment.

Referring to FIG. 1A, a display device DD may display an image IM through a display surface DD-IS. FIG. 1A exemplarily illustrate a watch display window and an application icon as the image IM. The display surface DD-IS includes a display area DD-DA, on which an image IM is displayed, and a non-display area DD-NDA that is adjacent to the display area DD-DA. The non-display area DD-NDA may be an area on which an image is not displayed.

For example, the non-display area DD-NDA may surround the display area DD-DA. However, the inventive concepts are not limited thereto. For example, in some embodiments, the non-display area DD-NDA may be adjacent to only a portion of the display area DD-DA or may be omitted.

A display surface DD-IS may have a shape extending in a first direction DR1 and a second direction DR2 crossing the first direction DR1. A normal direction of the display surface DD-IS, e.g., a thickness direction of the display device DD is indicated as a third direction DR3. As used herein, the phrase "when viewed in a plan view" or "in the plan view" may refer to when viewed in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be relative terms, and thus, may be changed into different directions, for example, opposite directions.

According to an embodiment, at least a portion of the display surface DD-IS may have a curved shape in a plan view. For example, a corner portion of the display surface DD-IS may have a curved shape in the plan view. Although the illustrated embodiment shows the corner portion of the display surface DD-IS as having the curved shape, the inventive concepts are not limited thereto. For example, in some embodiments, at least a portion of outer portions of the display surface DD-IS may have a curved shape.

A portion of the display device DD may also include a solid display surface in the plan view. The solid display surface may include a plurality of display areas that indicate different directions. For example, the solid display surface may include a polygonal column-type display surface.

According to the illustrated embodiment, the display device DD is exemplarily illustrated as being capable of applied to a mobile terminal. However, in other embodiments, electronic modules, a camera module, a power module, and the like, which are mounted on a main board, may be disposed on a bracket/case together with the display device DD to form the mobile terminal. The display device DD according to an embodiment may be applied to large-sized electronic apparatuses, such as televisions and monitors, and small and middle-sized electronic apparatuses, such as tablet PC, navigation units for vehicles, game consoles, and smart watches.

Referring to FIG. 1B, a display device DDa may include a display area DD-DA having an irregular shape. For example, the display area DD-DA of FIG. 1B may further include a portion that protrudes in the first direction DR1 as compared to the display area DD-DA of FIG. 1A. The display device DDa may include a speaker SP and a camera module CMA, which are disposed adjacent to a portion of the display area DD-DA having the protruding shape. The speaker SP and the camera module CMA may be disposed to overlap the non-display area DD-NDA, so as not to overlap the display area DD-DA. Although not shown, the display device DD of FIG. 1A may also include a speaker SP and a camera module, which are disposed to overlap the non-display area DD-NDA.

In some embodiments, the camera module CMA may be provided in a structure that overlaps the display area DD-DA.

Figure 2:
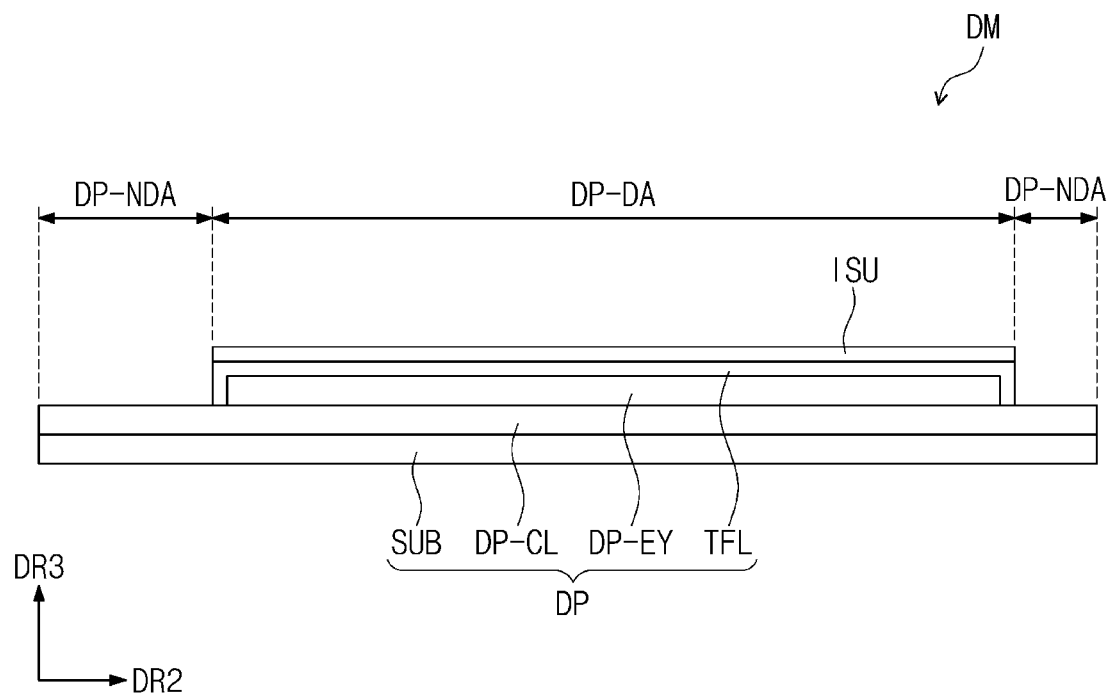
FIG. 2 is a cross-sectional view of a display module according to an embodiment.

FIG. 2 is a cross-sectional view of a display module according to an embodiment.

Referring to FIG. 2, the display panel DP includes a substrate SUB, a circuit element layer DP-CL disposed on the substrate SUB, a display element layer DP-EY, and an encapsulation layer TFL.

According to an embodiment, the display panel DP may be an emission type display panel, without being limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the display panel DP will be described with reference to an organic light emitting display panel.

The display panel DP includes a display area DP-DA and a non-display area DP-NDA. The display area DP-DA of the display panel DP may correspond to the display area DD-DA of FIG. 1A, and the non-display area DP-NDA may correspond to the non-display area DD-NDA of FIG. 1A.

The substrate SUB may include at least one plastic film. The substrate SUB may include a plastic substrate, a glass substrate, a metal substrate, or an organic/inorganic composite substrate as a flexible substrate.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like.

The display element layer DP-EY may include a plurality of organic light emitting diodes. The display element layer DP-EY may further include an organic layer, such as a pixel defining layer. According to another embodiment, when the display panel is provided as a liquid crystal display panel, the display element layer may be provided as a liquid crystal layer.

The encapsulation layer TFL seals the display element layer DP-EY. For example, the encapsulation layer TFL may be a thin film encapsulation layer. The encapsulation layer TFL protects the display element layer DP-EY against foreign substances, such as moisture, oxygen, and dust particles. However, the inventive concepts are not limited thereto. For example, in some embodiments, an encapsulation substrate may be provided instead of the encapsulation layer TFL. In this case, the encapsulation substrate may be opposite to the substrate SUB, and the circuit element layer DP-CL and the display element layer DP-EY may be disposed between the encapsulation substrate and the substrate SUB.

The input sensing unit ISU may be disposed on the display panel DP. In some embodiments, the input sensing unit ISU may be disposed between the window and the display panel DP. The input sensing unit ISU senses an input applied from the outside. The input applied from the outside may be provided in various manners. For example, the input may be various types of external inputs, such as a portion of user's body, a stylus pen, light, heat, a pressure, or the like. Also, an input through contact with the portion of the human body, such as user's hands, as well as adjacent or neighboring space touches (for example, hovering) may also be one form of the input.

The input sensing unit ISU may be directly disposed on the display panel DP. As used herein, the phrase that "an element A is directly disposed on an element B" may refer to that an adhesion member is not disposed between the elements A and B. In an embodiment, the input sensing unit ISU may be manufactured by a continuous process together with the display panel DP. However, the inventive concepts are not limited thereto. For example, in some embodiments, the input sensing unit ISU may be provided as an individual panel, and then be coupled to the display panel DP through an adhesion layer. As another example, the input sensing unit ISU may be omitted.

Figure 3:
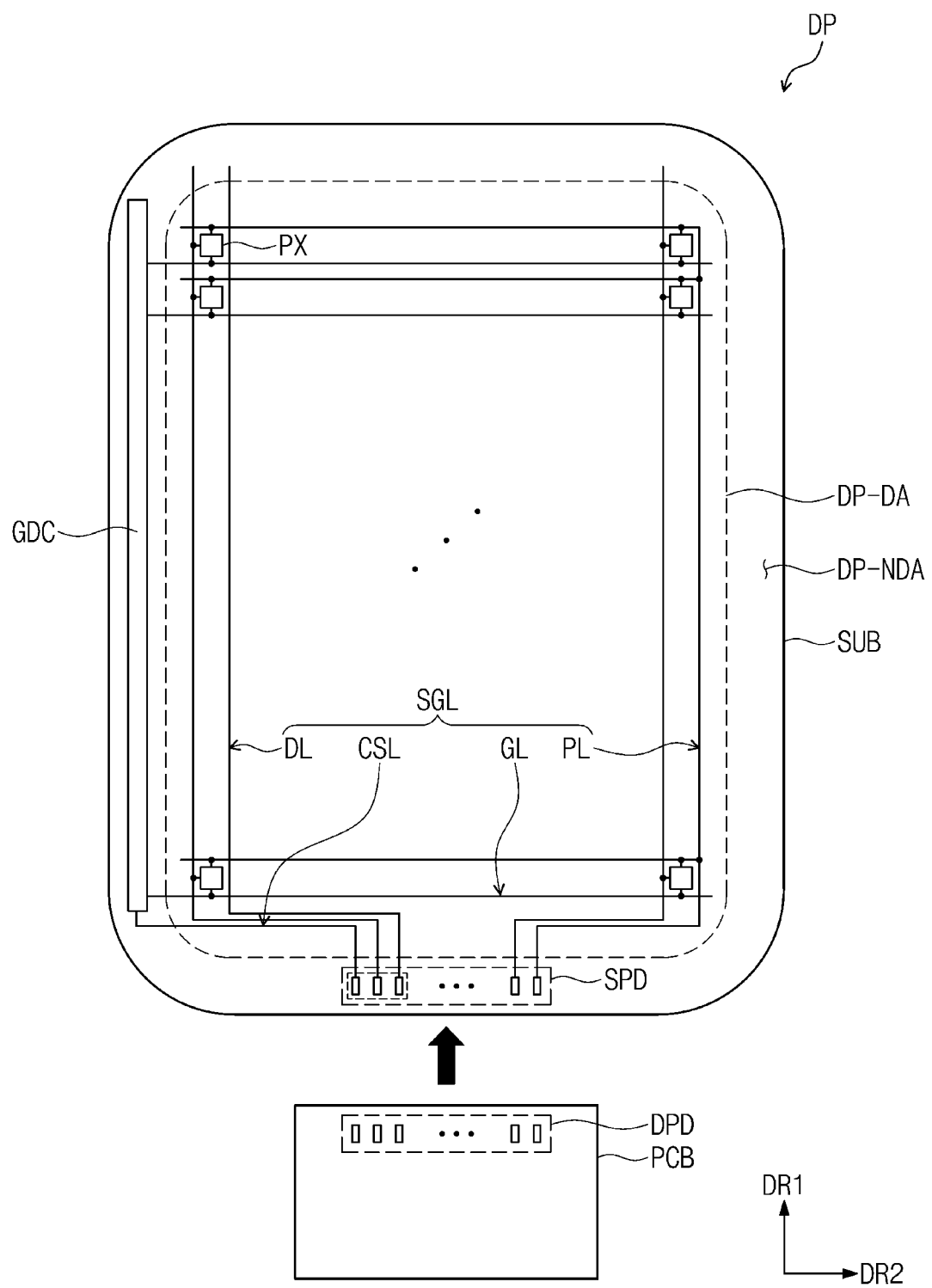
FIG. 3 is a plan view of the display panel according to an embodiment.

FIG. 3 is a plan view of the display panel according to an embodiment.

Referring to FIG. 3, each of the display area DP-DA and the non-display area DP-NDA of the display panel DP may have curved corners.

As used herein, the term 'corner' may refer to an edge that connect two sides, which extend in different directions, to each other. For example, the display area DP-DA may include a first side extending in the first direction DR1, a second side extending in the second direction DR2, a third side extending in the first direction to face the second side, and a fourth side extending in the second direction DR2 to face the first side in the plan view. The display area DP-DA includes a first corner portion connecting the first side to the second side, a second corner portion connecting the second side to the third side, a third corner portion connecting the third side to the fourth side, and a fourth corner portion connecting the fourth side to the first side. Each of the first to fourth corner portions has a curved shape.

The display panel DP may include a driving circuit GDC, a plurality of signal lines SGL, a plurality of pads SPD, and a plurality of pixels PX (hereinafter, referred to as pixels). The pixels PX are disposed on the display area DP-DA. Each of the pixels PX may include an organic light emitting diode and a pixel driving circuit connected to the organic light emitting diode.

The driving circuit GDC generates a plurality of scan signals (hereinafter, referred to as scan signals) to sequentially output the scan signals to a plurality of scan lines GL (hereinafter, referred to as scan lines), which will be described in more detail later. The driving circuit GDC may further output other control signals to the driving circuit of each of the pixels PX.

The driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL overlaps the display area DP-DA and the non-display area DP-NDA, and are connected to the pads SPD. The signal lines SGL include scan lines GL, data lines DL, a power line PL, and a control signal line CSL. The scan lines GL are respectively connected to corresponding pixels PX, and the data lines DL are respectively connected to corresponding pixels PX. The power line PL is connected to the pixels PX. The control signal line CSL may provide control signals to the scan driving circuit.

A driving chip electrically connecting the pads PD to the signal lines SGL may be disposed on the substrate SUB and overlap the non-display area DP-NDA. The driving chip transmits a driving signal to the data lines DL and the power line PL.

The pads SPD may be disposed on one area of the substrate SUB and overlap the non-display area DP-NDA. The pads SPD may be electrically connected to a circuit board PCB to transmit the driving signal received from the circuit board PCB to the signal lines SGL. The circuit board PCB may be rigid or flexible. For example, when the circuit board PCB is flexible, the circuit board PCB may be provided as a flexible printed circuit board.

The circuit board PCB may include driving pads DPD. The driving pads DPD may overlap the pads SPD in the plan view and be connected to the pads SPD.

Figure 4:
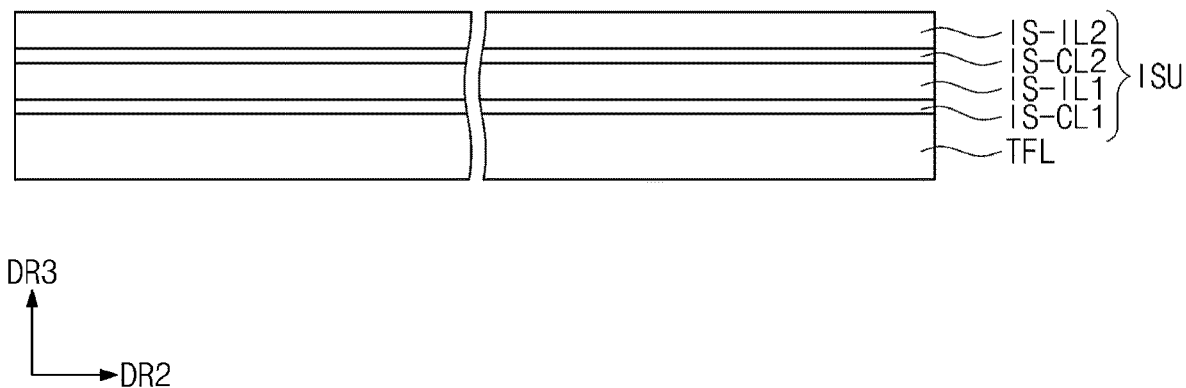
FIG. 4 is a cross-sectional view of an input sensing unit according to an embodiment.

FIG. 4 is a cross-sectional view of the input sensing unit according to an embodiment.

Referring to FIG. 4, the input sensing unit ISU includes a first conductive layer IS-CL1, a first insulation layer IS-IL1, a second conductive layer IS-CL2, and a second insulation layer IS-IL2. The first conductive layer IS-CL1 may be directly disposed on the encapsulation layer TFL.

Each of the first conductive layer IS-CL1 and the second conductive layer IS-CL2 may have a single-layer structure or a multi-layer structure, in which a plurality of layers are stacked in the third direction DR3. The conductive layer having the multilayer structure may include at least two of the transparent conductive layers and the metal layers. The conductive layer having the multilayer structure may include metal layers including different metals. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may be formed of molybdenum, silver, titanium, copper, aluminum, and an alloy thereof. For example, each of the first and second conductive layers IS-CL1 and IS-CL2 may have a three-layered metal structure, for example, a three-layered structure of titanium/aluminum/titanium.

Each of the first and second conductive layers IS-CL1 and IS-CL2 may include a plurality of conductive patterns. The first conductive layer IS-CL1 according to an embodiment includes a first sensing group, and the second conductive layer IS-CL2 includes a second sensing group. According to an embodiment, the conductive patterns disposed on the same layer may be formed through the same process, include the same material, and have the same laminated structure. The first sensing group and the second sensing group may overlap the display area DP-DA.

Each of the first and second insulation layers IS-IL1 and IS-IL2 may include an inorganic or organic material. According to the illustrated embodiment, each of the first and second insulation layers IS-IL1 and IS-IL2 may include an organic layer including an organic material. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

However, the inventive concepts are not limited thereto. For example, each of the first and second insulation layers IS-IL1 and IS-IL2 may be provided as an inorganic layer including an inorganic material. In this case, the inorganic layer may include at least one of oxide, titanium oxide, silicon oxide, silicon oxide nitride, zirconium oxide, or hafnium oxide.

According to an embodiment, the input sensing unit ISU may sense an external input in a capacitance manner. For example, the input sensing unit ISU may calculate coordinate information of the external input on the basis of capacitance that varies between the second conductive patterns included in the second conductive layer IS-CL2. In some embodiments, the input sensing unit ISU may sense the external input in a resistance-variable manner.

Figure 5:
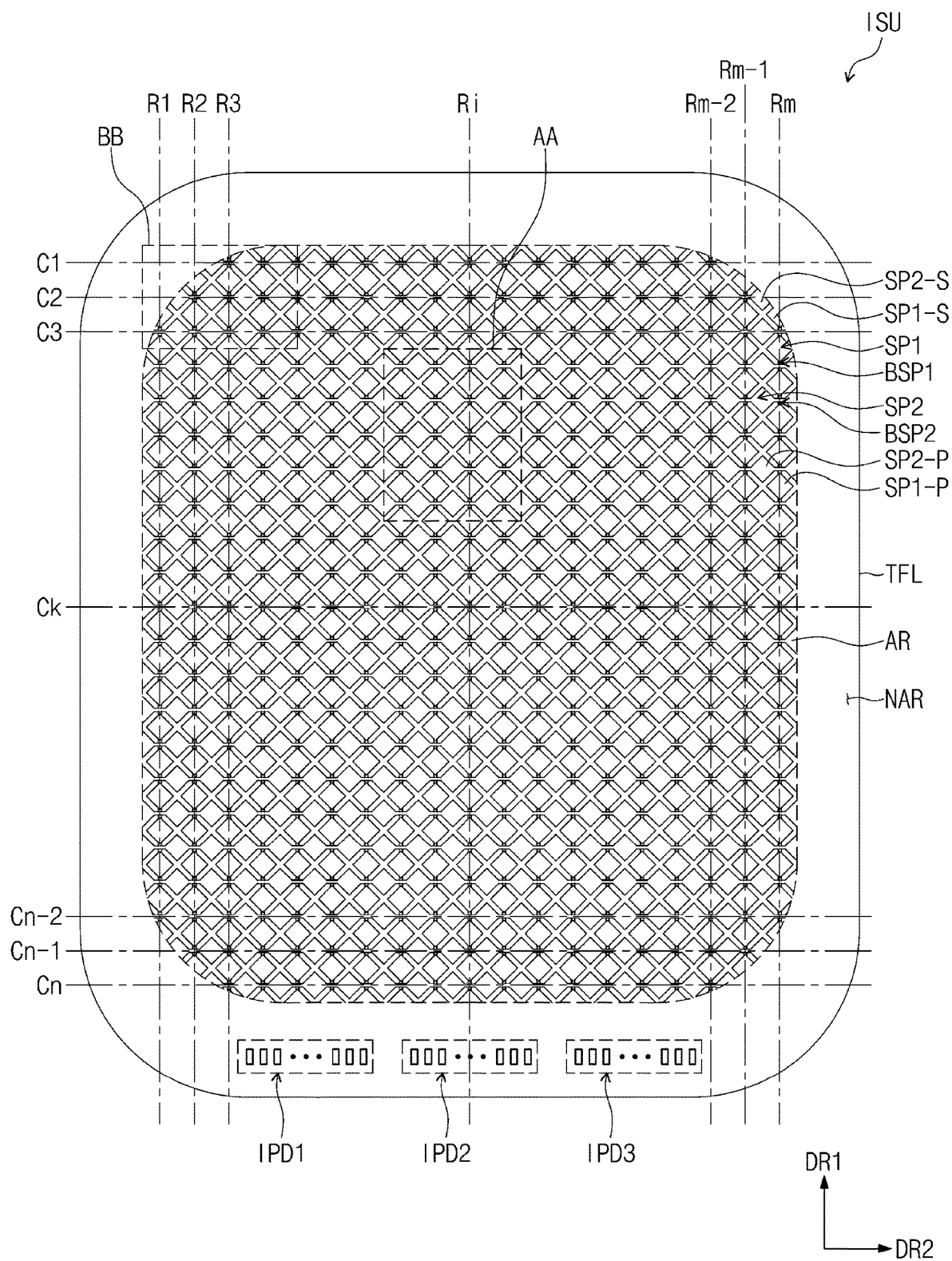
FIG. 5 is a plan view of the input sensing unit according to an embodiment.
Figure 6A:
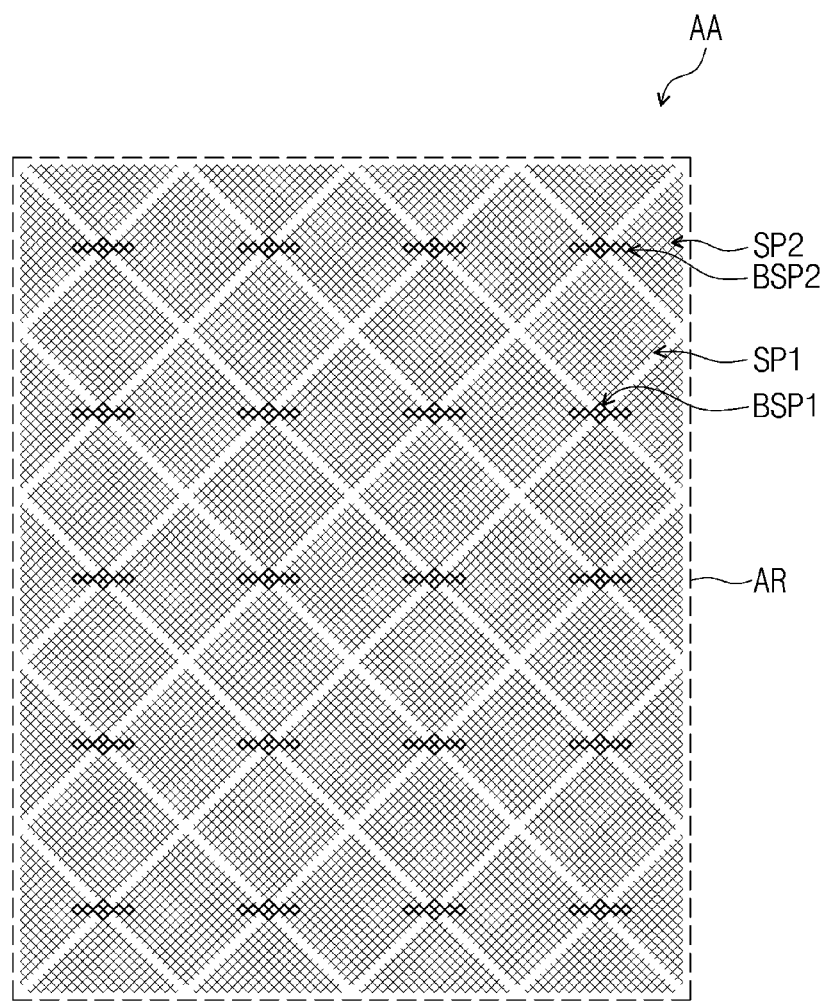
FIG. 6A is an enlarged plan view of an area AA of FIG. 5 according to an embodiment.
Figure 6B:
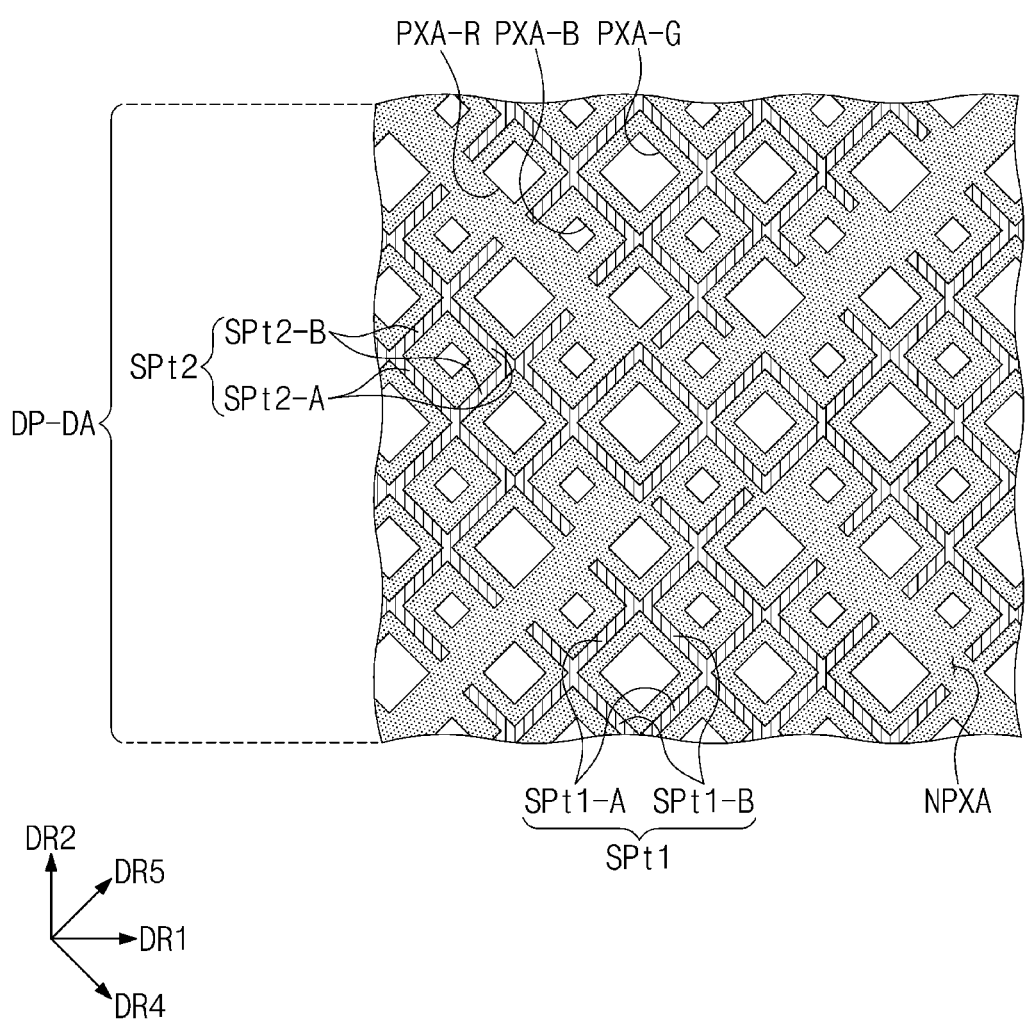
FIG. 6B is a plan view illustrating a portion of the input sensing unit according to an embodiment.

FIG. 5 is a plan view of the input sensing unit according to an embodiment. FIG. 6A is an enlarged plan view of an area AA of FIG. 5 according to an embodiment. FIG. 6B is a plan view illustrating a portion of the input sensing unit according to an embodiment. FIG. 6B is a plan view illustrating a portion of the input sensing unit according to an embodiment.

Referring to FIG. 5, the input sensing unit ISU defines a sensing area AR and a non-sensing area NAR that is adjacent to the sensing area AR. The sensing area AR of the input sensing unit ISU may overlap the display area DP-DA of the display panel DP that is defined above. The non-display area DP-NDA of the display panel DP may overlap the non-sensing area NAR of the input sensing unit ISU. In some embodiments, the non-sensing area NAR may be adjacent to only one side of the sensing area AR, or may be omitted.

The sensing area AR may be an area, on which an input applied from the outside is sensed. According to an embodiment, each of the sensing area AR and the non-sensing area NAR of the input sensing unit ISU may have a curved shape in the plan view, which may be the same as the shape of the display area DP-DA described above. As such, repeated descriptions thereof will be omitted. As shown in FIG. 5, each of the corner portions of the sensing area AR may have a curved shape.

More particularly, the input sensing area ISU includes first connection patterns BSP1 included in the first sensing group described with reference to FIG. 4 and first conductive patterns SP1, second conductive patterns SP2 and second connection patterns BSP2 included in the second sensing group described with reference to FIG. 4.

The first connection patterns BSP1 may be directly disposed on the encapsulation layer TFL, and be electrically connected to the first conductive patterns SP1 through contact holes defined in the first insulation layer IS-IL1. The second connection patterns BSP2, the first conductive patterns SP1, and the second conductive patterns SP2 may be disposed on the first insulation layer IS-IL1. The second connection patterns BSP2 may connect the second conductive patterns SP2 to each other.

The first conductive patterns SP1 overlap the sensing area AR, extend in the first direction DR1, and are arranged in the second direction DR2. According to an embodiment, the first conductive patterns SP1 arranged in the second direction DR2 may correspond to a plurality of columns R1 to Rm, respectively. The first conductive patterns SP1 may include a first regular group and a first irregular group.

The first irregular group includes the first conductive patterns SP1 respectively corresponding to first to third columns R1, R2, and R3, and the first conductive patterns SP1 respectively corresponding to $(m-2)^{th}$ to $m^{th}$ columns Rm-2, Rm-1, and Rm. According to an embodiment, the first conductive patterns SP1 included in the first irregular group may have shapes different from each other. As each of the corner portions of the sensing area AR described above has the curved shape, each of the shapes of the first conductive patterns SP1 adjacent to the corner portions may be deformed according to the curved shape of the corner portion.

For example, the first conductive patterns SP1 respectively corresponding to the first to third columns R1, R2, and R3 and the first conductive patterns SP1 respectively corresponding to the $(m-2)^{th}$ to $m^{th}$ columns Rm−2, Rm−1, and Rm may have shapes that are linearly symmetrical to each other.

According to an embodiment, each of the first conductive patterns SP1 included in the first irregular group includes a first pattern SP1-P and a second pattern SP1-S provided in a partial shape of the first pattern SP1-P and adjacent to the non-sensing area NAR. More particularly, each of the first pattern SP1-P and the second pattern SP1-S may be provided in plural, and the plurality of second patterns SP1-S may include first sub-patterns and the second sub-patterns spaced apart from each other in the first direction DR1 with the plurality of first patterns SP1-P therebetween. For example, in the plan view, each of the first pattern SP1-P and the second pattern SP1-S may have substantially a diamond shape, and a surface area of the first pattern SP1-P may be greater than that of the second pattern SP1-S.

Also, the first regular group is disposed between the third column R3 and the $(m-2)^{th}$ column Rm−2, and includes the plurality of first conductive patterns SP1, each of which has a shape corresponding to an $i^{th}$ column Ri. In particular, the first conductive patterns SP1 included in the first regular group may have substantially the same shape. Hereinafter, the plurality of first conductive patterns SP1 having the shape of the first conductive pattern SP1 corresponding to the $i^{th}$ column Ri will be referred to as first regular conductive patterns. The first conductive patterns SP1 corresponding to the first column R1 and the first conductive patterns SP1 corresponding to the $m^{th}$ column may be the outermost conductive patterns in the second direction DR2.

The second conductive patterns SP2 overlap the sensing area AR, extend in the second direction DR2, and are arranged in the first direction DR1. According to an embodiment, the second conductive patterns SP2 arranged in the first direction DR1 may correspond to a plurality of rows C1 to Cn, respectively. The second conductive patterns SP2 may include a second regular group and a second irregular group.

The second irregular group includes the second conductive patterns SP2 respectively corresponding to first to third rows C1, C2, and C3 and the second conductive patterns SP2 respectively corresponding to $(n-2)^{th}$ to $n^{th}$ rows Cn−2, Cn−1, and Cn. According to an embodiment, the second conductive patterns SP2 included in the second irregular group may have shapes different from each other. As each of the corner portions of the sensing area AR has the curved shape, each of the shapes of the second conductive patterns SP2 adjacent to the corner portions may be deformed according to the curved shape of the corner portion.

According to an embodiment, each of the second conductive patterns SP2 included in the second irregular group includes a third pattern SP2-P and a fourth pattern SP2-S provided in a partial shape of the third pattern SP2-P and adjacent to the non-sensing area NAR. More particularly, each of the third pattern SP2-P and the fourth pattern SP2-S may be provided in plural, and the plurality of fourth patterns SP2-S may be spaced apart from each other in the second direction DR2 to face each other with the plurality of third patterns SP2-P therebetween. For example, in the plan view, each of the third pattern SP2-P and the fourth pattern SP2-S may have substantially a diamond shape, and a surface area of the third pattern SP2-P may be greater than that of the fourth pattern SP2-S.

For example, the second conductive patterns SP2 respectively corresponding to the first to third rows C1, C2, and C3 and the second conductive patterns SP2 respectively corresponding to the $(n-2)^{th}$ to $n^{th}$ rows Cn−2, Cn−1, and Cn may have shapes that are linearly symmetrical to each other.

The second regular group is disposed between the third row C3 and the $(n-2)^{th}$ row Cn2, and includes the plurality of second conductive patterns SP2, each of which has a shape corresponding to a $k^{th}$ row Ck. More particularly, the second conductive patterns SP2 included in the second regular group may have substantially the same shape. Hereinafter, the plurality of second conductive patterns SP2 having the shape of the first conductive pattern SP1 corresponding to the $k^{th}$ row Ck will be referred to as second regular conductive patterns. The second conductive pattern SP2 corresponding to the first row C1 and the second conductive pattern SP2 corresponding to the $n^{th}$ row may be the outermost conductive patterns in the first direction DR1.

According to an embodiment, each of the first connection patterns BSP1, the first conductive patterns SP1, the second conductive patterns SP2, and the second connection patterns BSP2 may include transparent conductive oxide. Hereinafter, the first connection patterns BSP1, the first conductive patterns SP1, the second conductive patterns SP2, and the second connection patterns BSP2 will collectively be referred to as sensing electrodes.

According to an embodiment, each of the sensing electrodes may include at least one of indium zinc oxide (IZO), indium tin oxide (ITO), indium gallium oxide (IGO), indium zinc gallium oxide (IGZO), or a mixture/compound thereof. However, the inventive concepts are not limited thereto. For example, in some embodiments, the first sensing electrode may include a metal material. The metal material may include, for example, molybdenum, silver, titanium, copper, aluminum, and an alloy thereof.

More particularly, according to an embodiment, the sensing electrodes may have a metal mesh structure to reduce visibility of the patterns from the outside.

In particular, referring to FIG. 6A, each of the first pattern SP1-P and the second pattern SP1-S of each of the first conductive patterns SP1 may have a mesh shape. Each of the third pattern SP2-P and the fourth pattern SP2-S of each of the second conductive patterns SP2 may have a mesh shape. Similarly, the first connection patterns BSP1 and the second connection patterns BSP2 may also have a mesh shape.

Referring to FIG. 6B, the display area DP-DA includes a plurality of pixel areas PXA-R, PXA-G, and PXA-B, and a light blocking area NPXA adjacent to the pixel areas PXA-R, PXA-G, and PXA-B. For example, the light blocking layer NPXA may surround the pixel areas PXA-R, PXA-G, and PXA-B. Each of the pixel areas may be an area, through which light is actually emitted to the outside through the display surface DD-IS described with reference to FIG. 1A.

Each of the first conductive patterns SP1 includes first mesh lines SPt1 defining mesh openings. Although the first mesh lines SPt1 are described as defining the mesh openings, however, at least some of the first mesh lines SPt1 may not define the mesh openings. For example, some of the first mesh lines SPt1 adjacent to edges of the first pattern SP1-P and the second pattern SP1-S of the first conductive pattern SP1 may not define the mesh openings.

Each of the second conductive patterns SP2 includes second mesh lines SPt2 that define mesh openings. Similarly, although the second mesh lines SPt2 are described as defining the mesh openings, at least some of the second mesh lines SPt2 may not define the mesh openings. For example, some of the second mesh lines SPt2 adjacent to edges of the third pattern SP2-P and the fourth pattern SP2-S of the second conductive pattern SP2 may not define the mesh openings.

According to an embodiment, a surface area of each of the mesh openings in the plan view may be greater than that of each of the pixel areas.

Also, each of the first mesh lines SPt1 and the second mesh lines SPt2 overlaps the light blocking area NPXA. Each of the first mesh lines SPt1 includes two first extension parts SPt1-A extending in a fifth direction DR5 crossing the first direction DR1 and the second direction DR2 and two second extension parts SPt1-B extending in a fourth direction DR4 crossing the fifth direction DR5. The first extension parts SPt1-A may face each other and may be connected to the second extension parts SPt1-B. The second extension parts SPt1-B may face each other and may be connected to the first extension parts SPt1-A.

Each of the second mesh lines SPt2 includes two third extension parts SPt2-A extending in the fourth direction DR4 crossing the first direction DR1 and the second direction DR2 and two fourth extension parts SPt2-B extending in the fifth direction DR5 crossing the fourth direction DR4. The third extension parts SPt2-A may face each other and may be connected to the fourth extension parts SPt2-B. The fourth extension parts SPt2-B may face each other and may be connected to the third extension parts SPt2-A.

Referring back to FIG. 5, the input sensing unit ISU includes a plurality of pad groups IPD1, IPD2, and IPD3, and signal lines. The pad groups IPD1, IPD2, and IPD3 may receive a driving signal through the circuit board PCB described with reference to FIG. 3, or may be electrically connected to a separate circuit board to receive a driving signal.

The signal lines may overlap the non-sensing area NAR to transmit the driving signals transmitted from the plurality of pad groups IPD1, IPD2, and IPD3 to the first sensing group and the second sensing group.

The first pad group IPD1 may include a plurality of first sensing pads, and the first sensing pads may be electrically connected to one ends of the first conductive patterns through the first lines of the signal lines, respectively. The second pad group IPD2 may include a plurality of second sensing pads, and the second sensing pads may be electrically connected to the other ends of the first conductive patterns through the second lines of the signal lines, respectively. The third pad group IPD3 may include a plurality of third sensing pads, and the third sensing pads may be electrically connected to one ends of the second conductive patterns through the third lines of the signal lines, respectively.

Each of the signal lines and the first to third pad groups IPD1, IPD2, and IPD3 may include a metal material, or may include molybdenum, silver, titanium, copper, aluminum, or an alloy thereof.

The first conductive patterns SP1 included in the first irregular group, and the first conductive patterns SP1 included in the first regular group may have shapes different from each other. Similarly, the second conductive patterns SP2 included in the second irregular group and the second conductive patterns SP2 included in the second regular group may have shapes different from each other.

More particularly, the shape of the conductive pattern included in the irregular group in the plan view may have a partial shape of the conductive pattern included in the regular group. A planar area of the conductive pattern included in the regular group may be greater than that of the conductive pattern included in the irregular group. As such, when the same external input is applied, capacitance between the external input and the conductive pattern of the irregular group and capacitance between the external input and the conductive pattern of the regular group may be different from each other.

Figure 7:
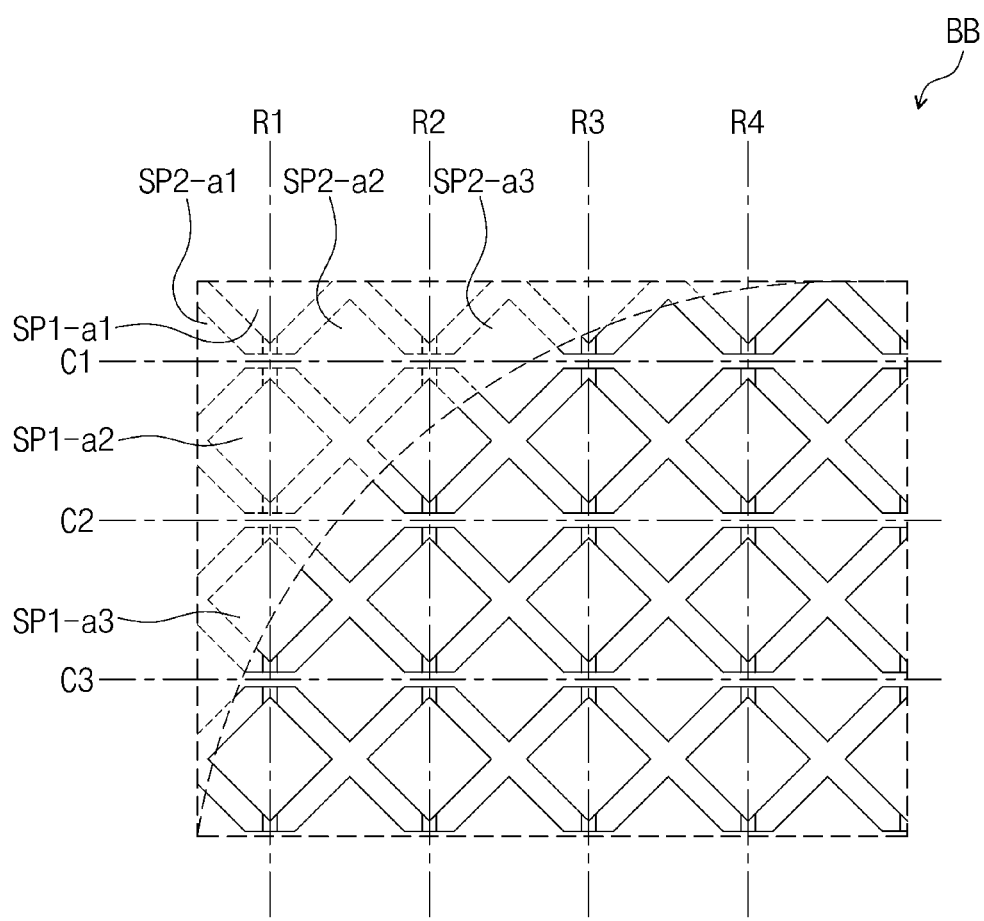
FIG. 7 is an enlarged plan view of an area BB of FIG. 5 according to an embodiment.
Figure 8:
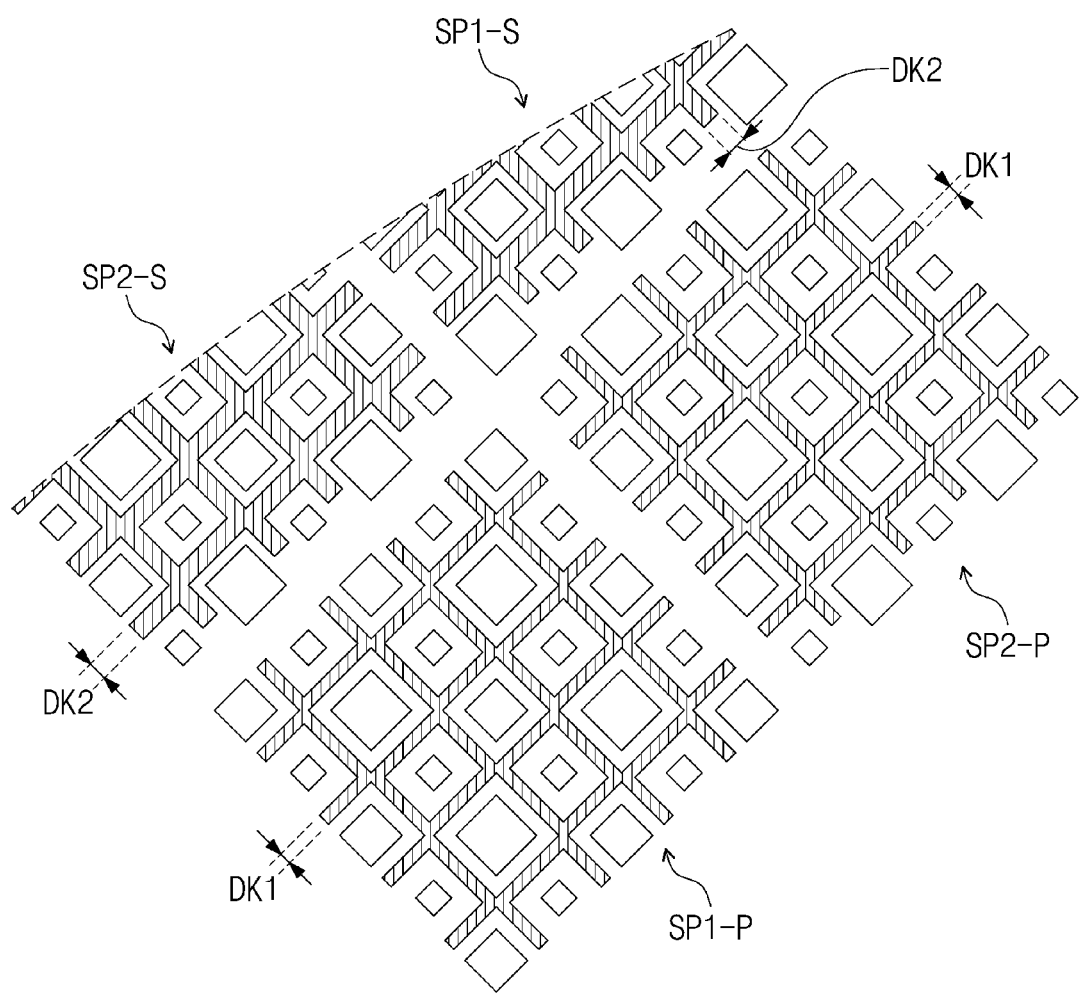
FIG. 8 is a plan view illustrating a portion of a conductive pattern of FIG. 7 according to an embodiment.

FIG. 7 is an enlarged plan view of an area BB of FIG. 5 according to an embodiment. FIG. 8 is a plan view illustrating a portion of the conductive pattern of FIG. 7 according to an embodiment.

FIG. 7 illustrates the first conductive patterns SP1 included in the first irregular group corresponding to the first to third columns R1, R2, and R3, and the second conductive patterns SP2 included in the second irregular group corresponding to the first to third rows C1, C2, and C3.

Referring to FIGS. 5 and 7, each of the first conductive patterns SP1 corresponding to the first to third columns R1, R2, and R3 may have a partial shape of each of the first conductive patterns SP1 included in the first regular group. For example, the first conductive pattern SP1 corresponding to the first column R1 may have a shape, in which the first to third portions SP1-a1, SP1-a2, and SP1-a3 of the first conductive patterns SP1 included in the first regular group are removed. The first conductive pattern SP1 corresponding to the fourth column R4 may also have a shape, in which at least some of the first conductive patterns SP1 included in the first regular group are removed.

According to an embodiment, each of the second patterns SP1-S of the first conductive patterns SP1 corresponding to the first to third columns R1, R2, and R3 may have a line width greater than that of each of the first patterns SP1-P. The line width may refer to a line width of the mesh line included in each of the conductive patterns. The line width of the second pattern SP1-S may refer to a line width of each of the mesh lines forming the second pattern SP1-S, and the line width of the first pattern SP1-P may refer to a line width of each of the mesh lines forming the first pattern SP1-P.

Since the line width of the second pattern SP1-S is greater than that of the first pattern SP1-P, the capacitance of the first conductive pattern SP1, due to the removed areas of the first to third portions SP1-a1, SP1-a2, and SP1-a3, may be compensated. In particular, since the line width of the second pattern SP1-S increases, the planar area of the first conductive pattern SP1 may be increased. As such, the overall capacitance of the first conductive pattern SP1 may also be increased.

Also, each of the second conductive patterns SP2 corresponding to the first to third rows C1, C2, and C3 may have a partial shape of each of the second conductive patterns SP2 included in the second regular group. For example, the second conductive pattern SP2 corresponding to the first row C1 may have a shape, in which the first to third portions SP2-a1, SP2-a2, and SP2-a3 of the second conductive patterns SP2 included in the second regular group are removed.

According to an embodiment, each of the fourth patterns SP2-S of the second conductive patterns SP2 corresponding to the first to third rows C1, C2, and C3 may have a line width greater than that of each of the third patterns SP2-P. As such, the capacitance of the second conductive pattern SP2, due to the removed areas of the first to third portions SP2-a1, SP2-a2, and SP2-a3, may be compensated. In particular, since the line width of the fourth pattern SP2-S increases, the planar area of the second conductive pattern SP2 may be increased. In this manner, the overall capacitance of the second conductive pattern SP2 may also be increased.

Referring to FIG. 8, the first pattern SP1-P of the first conductive patterns SP1 included in the first regular group may have a first line width DK1. On the other hand, the second pattern SP1-S of the first conductive patterns SP1 included in the first irregular group may have a second line width DK2 greater than the first line width DK1.

The third pattern SP2-P of the second conductive patterns SP2 included in the second regular group may have the same first line width DK1 as the first pattern SP1-P. On the other hand, the fourth pattern SP2-S of the second conductive patterns SP2 included in the second irregular group may have a second line width DK2 greater than the first line width DK1.

According to an embodiment, the line width of the second pattern SP1-S may range from 1.0 times to 2.5 times of the line width of the first pattern SP1-P. This is because when the line width of the second pattern SP1-S increases by 2.5 times or more, a portion of the second pattern SP1-S may overlap the pixel area, which may deteriorate visibility.

Although FIG. 8 shows that the line widths of the second pattern SP1-S and the fourth pattern SP2-S are the same, in some embodiments, the line widths of the second pattern SP1-S and the fourth pattern SP2-S may be different from each other.

According to an embodiment, the line widths of the second patterns SP1-S according to at least two first conductive patterns SP1 included in the first irregular group may be different from each other. For example, a first planar area of the first conductive pattern SP1 corresponding to the first column R1 described with reference to FIG. 7 may be less than a second planar area of the first conductive pattern SP1 corresponding to the second column R2. As such, the line width of the second pattern SP1-S according to the first conductive pattern SP1 of the first column R1 may be greater than that of the second pattern SP1-S according to the first conductive pattern SP1 of the second column R2.

Similarly, the line widths of the second patterns SP1-S according to at least two first conductive patterns SP1 included in the second irregular group may be different from each other. For example, the line width of the fourth pattern SP2-S according to the second conductive pattern SP2 of the first row C1 may be greater than that of the fourth pattern SP2-S according to the second conductive pattern SP2 of the second row C2.

Figure 9:
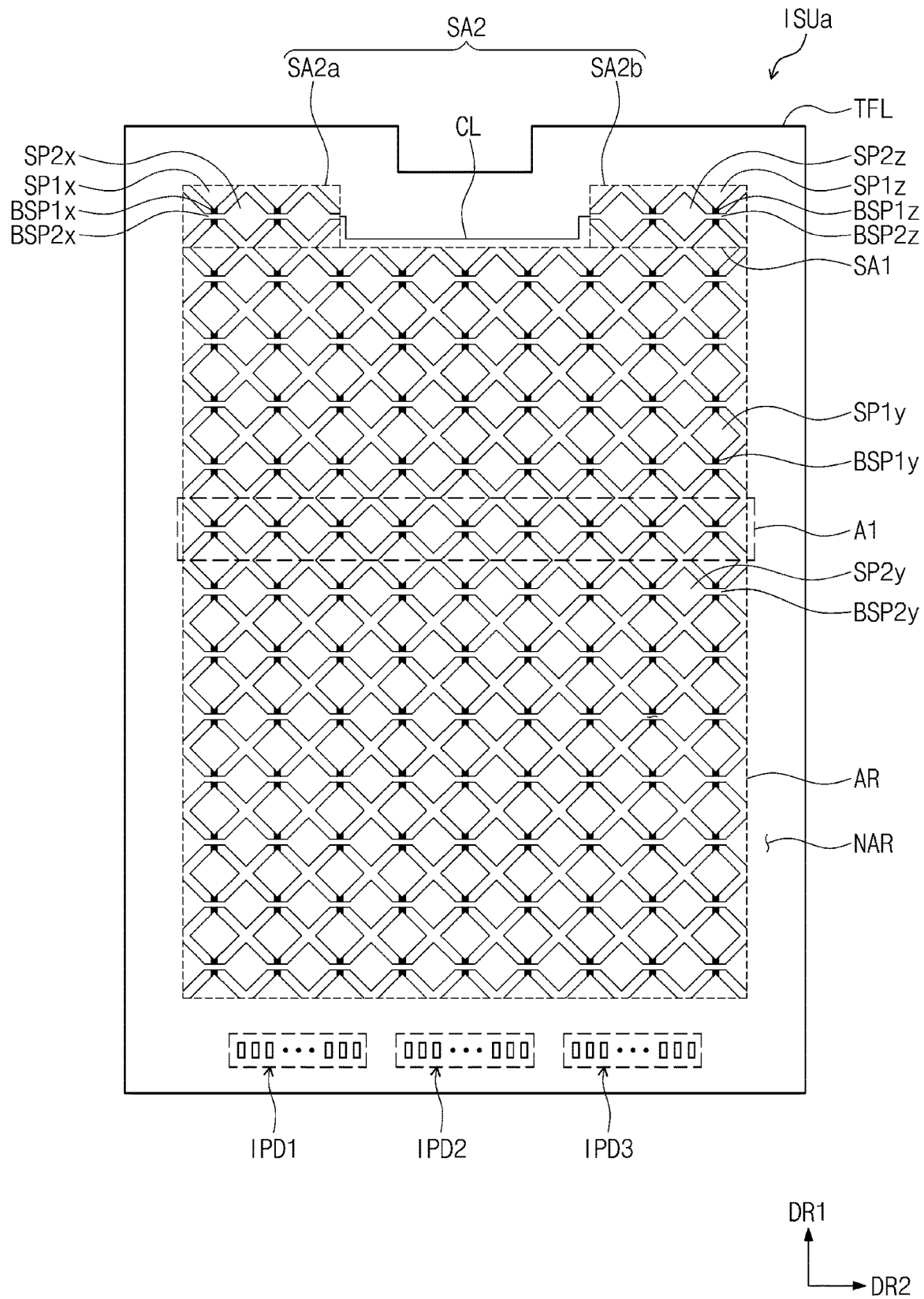
FIG. 9 is a plan view of an input sensing unit according to another embodiment.
Figure 10A:
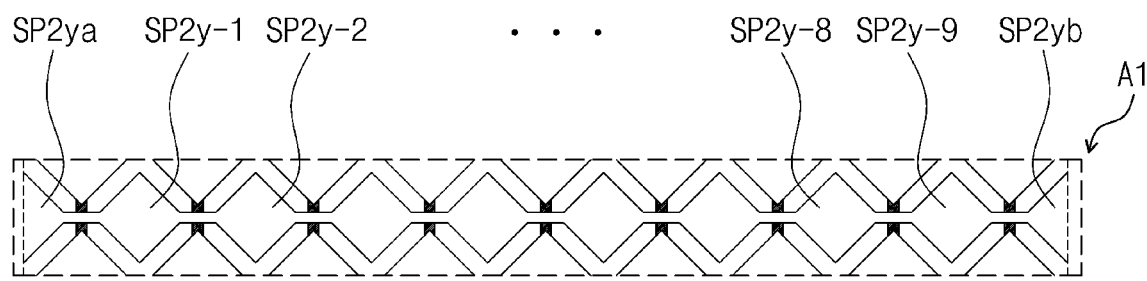
FIG. 10A is an enlarged plan view of an area A1 of FIG. 9.
Figure 10B:
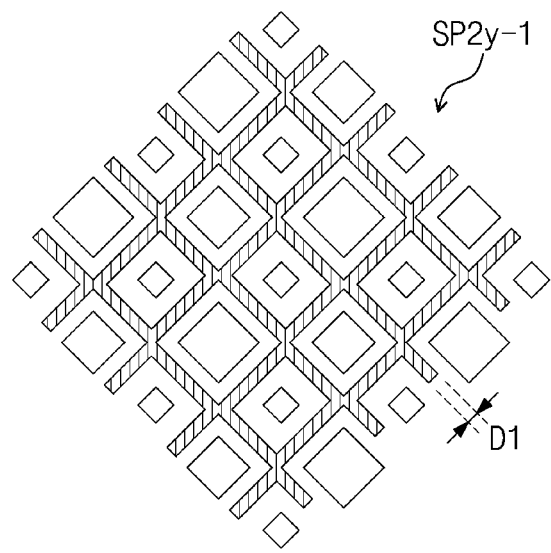
FIG. 10B is an enlarged plan view illustrating a portion of the conductive pattern of FIG. 10A.
Figure 11A:
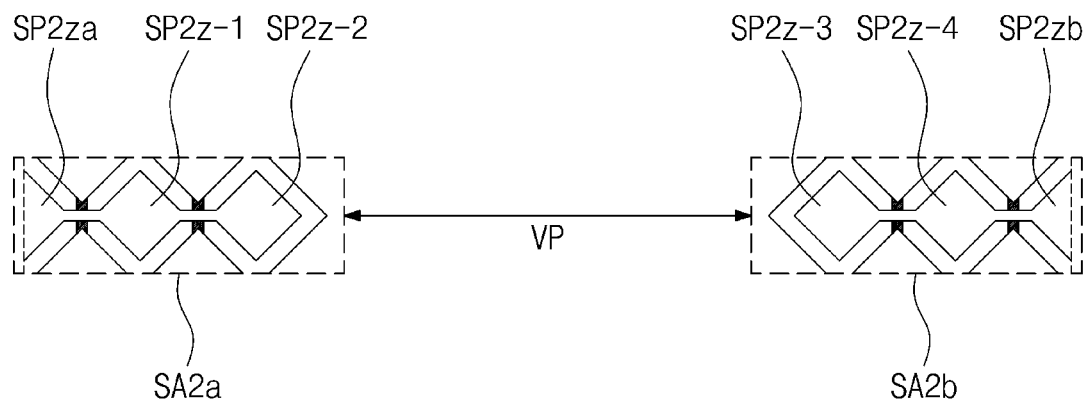
FIG. 11A is an enlarged plan view of a second sensing area of FIG. 9.
Figure 11B:
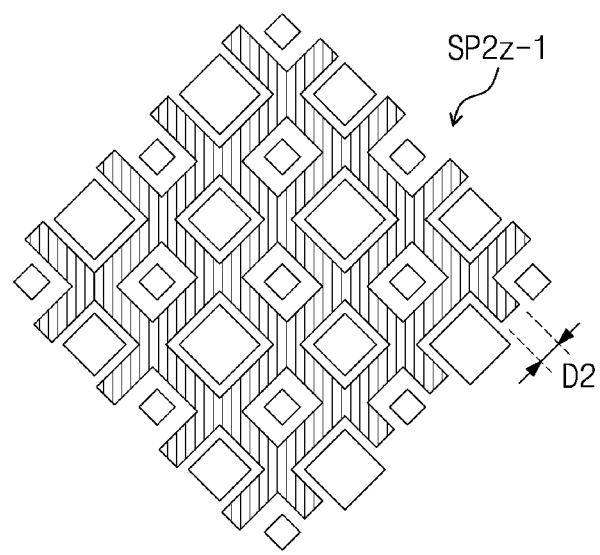
FIG. 11B is an enlarged plan view illustrating a portion of a conductive pattern of FIG. 11A.

FIG. 9 is a plan view of an input sensing unit according to another embodiment. FIG. 10A is an enlarged plan view of an area A1 of FIG. 9. FIG. 10B is an enlarged plan view illustrating a portion of the conductive pattern of FIG. 10A. FIG. 11A is an enlarged plan view of a second sensing area SA2 of FIG. 9. FIG. 11B is an enlarged plan view illustrating a portion of a conductive pattern of FIG. 11A.

As compared to the input sensing unit ISU illustrated in FIG. 5, an input sensing unit ISUa illustrated in FIG. 9 may be different from the input sensing unit ISU with respect to a shape of the sensing region AR and the non-sensing region NAR.

Referring to FIG. 9, the sensing area AR includes a first sensing area SA1 and a second sensing area SA2. The first sensing area SA1 may have a rectangular shape in a plan view. The second sensing area SA2 may protrude from the first sensing area SA1 in the first direction DR1. More particularly, the second sensing area SA2 includes a first sub sensing area SA2a and a second sub sensing area SA2b spaced apart from the first sub sensing area SA2a and facing the first sub sensing area SA2a in the second direction DR2. The first sensing area SA1 may be referred to as a normal part, and the second sensing area SA2 may be referred to as a notch part.

However, the shape of the sensing area AR is not limited thereto. For example, the shape of the sub sensing area included in the second sensing area SA2 may be variously modified. For example, in some embodiments, there may be one or three or more sub sensing areas protruding from the first sensing area SA1.

The first sub sensing area SA2a may protrude from one area of one edge of the first sensing area SA1 in the first direction DR1, and the second sub sensing area SA2b may protrude from the other area of the one edge of the first sensing area SA1.

In particular, the input sensing unit ISUa may include first conductive patterns SP1$y$, first connection patterns BSP1$y$, second conductive patterns SP2$y$, and second connection patterns BSP2$y$, which overlap the first sensing area SA1.

The first conductive patterns SP1$y$ extend in the first direction DR1 and are arranged in the second direction DR2. The second conductive patterns SP2$y$ are arranged in the first direction DR1 and extend in the second direction DR2. More particularly, the first conductive patterns SP1$y$ may correspond to the shape of the first conductive pattern SP1 of the first regular group illustrated in FIG. 5, and the second conductive patterns SP2$y$ may correspond to the shape of the second conductive pattern SP2 of the regular group illustrated in FIG. 5.

The input sensing unit ISUa may include first notch conductive patterns SP1$x$, first notch connection patterns BSP1$x$, second notch conductive patterns SP2$x$, and second notch connection patterns BSP2$x$, which overlap the first sub sensing area SA2$a$. The first notch connection patterns BSP1$x$ connect the first notch conductive patterns SP1$x$ to each other, and the second notch connection patterns BSP2$x$ connect the second notch conductive patterns SP2$x$ to each other.

The input sensing unit ISUa may include third notch conductive patterns SP1$z$, third notch connection patterns BSP1$z$, fourth notch conductive patterns SP2$z$, and fourth notch connection patterns BSP2$z$, which overlap the second sub sensing area SA2$b$. The third notch connection patterns BSP1$z$ connect the third notch conductive pattern SP1$z$ to each other, and the fourth notch connection patterns BSP2$z$ connect the fourth notch conductive pattern SP2$z$ to each other.

Hereinafter, the first notch conductive patterns SP1$x$, the second notch conductive patterns SP2$x$, the third notch conductive patterns SP1$z$, and the fourth notch conductive patterns SP2$z$ will be collectively be referred to as notch conductive patterns. In addition, the first notch connection patterns BSP1$x$, the second notch connection patterns BSP2$x$, the third notch connection patterns BSP1$z$, and the fourth notch connection patterns BSP2$z$ will be collectively be referred to as notch connection patterns.

According to an embodiment, the second notch conductive patterns SP2$x$ and the fourth notch conductive patterns SP2$z$ may be electrically connected to each other through connection lines CL.

Pad groups IPD1 to IPD3 may be electrically connected to the conductive patterns overlapping the sensing area AR to transmit driving signals through signal lines.

Referring to FIG. 10A, one second conductive pattern SP2$y$ of the second conductive patterns SP2$y$ overlapping the first sensing area SA1 is illustrated. Although one second conductive pattern SP2$y$ is illustrated in FIG. 10A, the remaining second conductive patterns SP2y overlapping the first sensing area SA1 may correspond to the shapes of the second conductive patterns described with reference to FIGS. 10A and 10B.

In particular, the second conductive pattern SP2y includes nine sensing patterns SP2y-1, SP2y-2 to SP2y-8, and SP2y-9 and two sub patterns SP2ya and SP2yb. The sensing patterns SP2y-1, SP2y-2 to SP2y-8, and SP2y-9 and the two sub patterns SP2ya and SP2yb may have a metal mesh shape. The sensing patterns SP2y-1, SP2y-2 to SP2y-8, and SP2y-9 have the same shape, and the two sub patterns SP2ya and SP2yb may also have the same shape.

Referring to FIG. 10B, one first sensing pattern SP2y-1 of the sensing patterns SP2y-1, SP2y-2 to SP2y-8, and SP2y-9 of the second conductive patterns SP2y is illustrated. Although not shown, the remaining sensing patterns of the sensing patterns SP2y-1, SP2y-2 to SP2y-8, and SP2y-9 may also correspond to the shapes of the first sensing patterns SP2y-1 illustrated in FIG. 10B.

According to an embodiment, the line width of each of the first sensing pattern SP2y-1 may have a first length D1. A line width of each of the mesh lines forming the first sensing patterns SP2y-1 may have a first length D1.

Referring to FIG. 11A, the notch conductive pattern overlapping the second sensing area SA2 is illustrated. The notch conductive pattern includes two first notch sensing patterns SP2z-1 and SP2z-2 and a first notch sub pattern SP2za, which correspond to the first sub sensing area SA2a, and two second notch sensing patterns SP2z-3 and SP2z-4 and a second notch sub pattern SP2zb, which correspond to the second sub sensing area.

The first sub sensing area SA2a and the second sub sensing area SA2b may face each other in the second direction DR2 at a predetermined interval VP. According to an embodiment, the predetermined interval VP may be 20% or more and 50% or less of the sum of the length of the first sub sensing area SA2a and the length of the second sub sensing area SA2b in the second direction DR2.

As shown in FIG. 11A, the notch sensing patterns SP2z-1, SP2z-2, SP2z-3, and SP2z-4 may have the same shape, and also have a mesh shape in the plan view. Also, each of the notch sensing patterns SP2z-1, SP2z-2, SP2z-3, and SP2z-4 may have the same shape as the first sensing pattern SP2y-1 illustrated in FIG. 10A, and may have a mesh shape.

Planar areas of the notch sensing patterns SP2z-1, SP2z-2, SP2z-3, and SP2z-4 illustrated in FIG. 8 may be less than that of the sensing patterns SP2y-1, SP2y-2 to SP2y-8, and SP2y-9 illustrated in FIG. 10A.

As such, based on the characteristics of the capacitance according to a unit area, capacitance between the notch sensing patterns SP2z-1, SP2z-2, SP2z-3, and SP2z-4 according to the external input, and capacitance between the sensing patterns SP2y-1, SP2y-2 to SP2y-8, and SP2y-9 according to the same external input may be different from each other.

According to an embodiment, the line width of each of the notch sensing patterns SP2z-1, SP2z-2, SP2z-3, and SP2z-4 may be greater than that of each of the sensing patterns SP2y-1, SP2y-2 to SP2y-8, and SP2y-9.

In particular, referring to FIG. 11B, one first notch sensing pattern SP2z-1 of the notch sensing patterns SP2z-1, SP2z-2, SP2z-3, and SP2z-4 is illustrated. Although not shown, the remaining sensing patterns of the notch sensing patterns SP2z-1, SP2z-2, SP2z-3, and SP2z-4 may also correspond to the shapes of the first notch sensing patterns SP2z-1 illustrated in FIG. 11B.

According to an embodiment, the line width of the first notch sensing pattern SP2z-1 may have a second length D2 greater than the first length D1 illustrated in FIG. 10B. A line width of each of the mesh lines forming the first notch sensing pattern SP2z-1 may have a second length D2 greater than the first length D1.

As described above, the line width of each of the notch sensing patterns on the second sensing area SA2 may be greater than that of each of the conductive patterns on the first sensing area SA1. Therefore, the capacitance of the notch sensing patterns on the second sensing area SA2 according to the space between the first sub sensing area SA2a and the second sub sensing area SA2b may be compensated.

According to embodiments, the conductive pattern included in the irregular group may have a planar area less than that of the conductive pattern included in the regular group. In this case, a portion of the conductive pattern included in the irregular group may have a line width greater than that of the conductive pattern included in the regular group. As a result, the planar area of the conductive pattern included in the irregular group may be increased, thereby having an increased capacitance.

In this manner, the overall sensing reliability of the input sensing unit may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display module comprising:
a display panel; and
an input sensing unit disposed on the display panel and having a sensing area and a non-sensing area adjacent to the sensing area, the input sensing unit comprising:
a plurality of first conductive patterns overlapping the sensing area, extending in a first direction, and arranged in a second direction perpendicular to the first direction; and
a plurality of second conductive patterns overlapping the sensing area, electrically insulated from the first conductive patterns, extending in the second direction, and arranged in the first direction,
wherein:
each of the first conductive patterns and the second conductive patterns includes mesh lines at least some of which define mesh openings;
at least one first conductive pattern of the first conductive patterns includes a first pattern and a second pattern, the second pattern having a partial shape of the first pattern and disposed adjacent to the non-sensing area; and
the second pattern has a line width greater than that of the first pattern in a plan view.

2. The display module of claim 1, wherein:
the first conductive patterns are divided into a first regular group and a first irregular group adjacent to the first regular group; and
each of first conductive patterns in the first irregular group corresponds to the one first conductive pattern.

3. The display module of claim 2, wherein the first irregular group includes two outermost first conductive patterns in the sensing area.

4. The display module of claim 2, wherein the second patterns of the first conductive patterns in the first irregular group have different line widths from each other.

5. The display module of claim 4, wherein the first patterns of the first conductive patterns in the first irregular group have the same line width.

6. The display module of claim 2, wherein the first conductive patterns of the first regular group have the same shape.

7. The display module of claim 6, wherein the first conductive patterns of the first irregular group have shapes different from each other.

8. The display module of claim 1, wherein:
each of the first pattern and the second pattern is formed in plural; and
the second patterns include first sub-patterns and second sub-patterns facing each other with the plurality of first patterns interposed therebetween.

9. The display module of claim 1, wherein:
at least one second conductive pattern of the second conductive patterns includes a third pattern and a fourth pattern, the fourth pattern having a partial shape of the third pattern and disposed adjacent to the non-sensing area, and
the fourth pattern has a line width greater than that of the third pattern in a plan view.

10. The display module of claim 9, wherein:
the second conductive patterns are divided into a second regular group and a second irregular group adjacent to the second regular group and having different shapes; and
each of second conductive patterns in the second irregular group corresponds to the one second conductive pattern.

11. The display module of claim 10, wherein:
the second conductive patterns of the second regular group have the same shape; and
the second conductive patterns of the second irregular group have different shapes from each other.

12. The display module of claim 9, wherein:
the first pattern and the third pattern have the same line widths; and
the second pattern and the fourth pattern have line widths different from each other.

13. The display module of claim 1, wherein each of the first conductive patterns and the second conductive patterns have a mesh shape.

14. The display module of claim 1, wherein the line width of the second pattern is in a range of 1.0 to 2.5 times of the line width of the first pattern.

15. The display module of claim 1, wherein:
the display panel comprises a substrate, a display element layer disposed on the substrate, and an encapsulation layer disposed on the display element layer; and
the input sensing unit is directly disposed on the encapsulation layer.

16. A display module comprising:
a display panel; and
an input sensing unit disposed on the display panel and having a sensing area and a non-sensing area adjacent to the sensing area, the sensing area including a first sensing area and a second sensing area protruding from the first sensing area in a first direction in a plan view, the input sensing unit comprising:
a plurality of first conductive patterns overlapping the first sensing area, extending in the first direction, and arranged in a second direction perpendicular to the first direction;
a plurality of second conductive patterns overlapping the first sensing area, electrically insulated from the first conductive patterns, extending in the second direction, and arranged in the first direction; and
a notch conductive pattern overlapping the second sensing area,
wherein each of the first conductive patterns and the second conductive patterns includes mesh lines at least some of which define mesh openings, and
wherein the notch conductive pattern has a line width greater than that of each of the second conductive patterns in a plan view.

17. The display module of claim 16, wherein:
each of the first conductive patterns, the second conductive patterns, and the notch conductive pattern has a mesh shape; and
each of the first conductive patterns and each of the second conductive patterns have the same line width.

18. The display module of claim 16, wherein:
the second sensing area includes a first sub-sensing area and a second sub-sensing area spaced apart from the first sub-sensing area and facing the first sub-sensing area in the second direction; and
the notch conductive pattern includes a first notch sensing pattern overlapping the first sub-sensing area and a second notch sensing pattern overlapping the second sub-sensing area.

19. The display module of claim 18, wherein a distance between the first sub-sensing area and the second sub-sensing area in the second direction is in a range of 20% to 50% of the sum of a length of the first sub-sensing area and a length of the second sub-sensing area in the second direction.

20. An input sensing module comprising:
a plurality of first conductive patterns extending in a first direction and arranged in a second direction perpendicular to the first direction; and
a plurality of second conductive patterns electrically insulated from the first conductive patterns, extending in the second direction, and arranged in the first direction,
wherein:
each of the first conductive patterns and the second conductive patterns includes mesh lines at least some of which define mesh openings;
at least one of the first conductive patterns includes a first pattern and a second pattern having a partial shape of the first pattern; and
the second pattern has a line width greater than that of the first pattern in a plan view.

* * * * *